United States Patent
Ifis

(10) Patent No.: US 12,167,529 B2
(45) Date of Patent: Dec. 10, 2024

(54) HEAT REMOVAL ARCHITECTURE FOR STACK-TYPE COMPONENT CARRIER WITH EMBEDDED COMPONENT

(71) Applicant: AT&S Austria Technologie & Systemtechnik Aktiengesellschaft, Leoben (AT)

(72) Inventor: Abderrazzaq Ifis, Leoben (AT)

(73) Assignee: AT&SAustria Technologie & Systemtechnik Aktiengesellschaft, Leoben (AT)

( * ) Notice: Subject to any disclaimer, the term of this patent is extended or adjusted under 35 U.S.C. 154(b) by 176 days.

(21) Appl. No.: 17/650,405

(22) Filed: Feb. 9, 2022

(65) Prior Publication Data
US 2022/0272828 A1 Aug. 25, 2022

(30) Foreign Application Priority Data
Feb. 10, 2021 (EP) .................................... 21156188

(51) Int. Cl.
*H05K 1/02* (2006.01)
(52) U.S. Cl.
CPC ... *H05K 1/0206* (2013.01); *H05K 2201/0753* (2013.01)
(58) Field of Classification Search
CPC ...... H05K 1/0206–0207; H05K 1/0298; H05K 1/0306; H05K 1/0353; H05K 1/09; H05K 1/11; H05K 1/115; H05K 1/142; H05K 1/144; H05K 1/183; H05K 1/185–186; H05K 1/0209; H05K 7/1432; H05K 7/209; H05K 7/2039; H05K 3/4655;
(Continued)

(56) References Cited

U.S. PATENT DOCUMENTS 7,025,129 B2 * 4/2006 Chiu ................... H01L 23/3737
257/E23.09
9,171,779 B2 * 10/2015 Lin ......................... H01L 33/20
(Continued)

FOREIGN PATENT DOCUMENTS

CN 109411423 A 3/2019
DE 102014013375 A1 3/2016
(Continued)

OTHER PUBLICATIONS

Wirner, Christoph; Extended European Search Report in Application No. 21156188.1; pp. 1-7; Aug. 13, 2021; European Patent Office; 80298, Munich, Germany.
(Continued)

*Primary Examiner* — Amir A Jalali
(74) *Attorney, Agent, or Firm* — Robert A. Blaha; Smith Tempel Blaha LLC

(57) ABSTRACT

A component carrier including a stack with at least one electrically conductive layer structure and/or at least one electrically insulating layer structure. A component embedded in the stack, and a heat removal body configured for removing heat from the component is connected to the stack and preferably to the component. The heat removal body including a component-sided first heat removal structure thermally coupled with the component, and a second heat removal structure thermally coupled with the first heat removal structure and facing away from the component.

18 Claims, 3 Drawing Sheets

(58) Field of Classification Search
CPC .. H05K 3/4673; H05K 3/4688; H05K 3/4691; H05K 2201/00753; H01L 21/76898; H01L 23/147; H01L 23/15; H01L 23/36; H01L 23/3735; H01L 23/49822; H01L 23/49827; H01L 23/5384; H01L 23/5386; H01L 23/5389

See application file for complete search history.

(56) References Cited

U.S. PATENT DOCUMENTS

| | | | |
|---|---|---|---|
| 2004/0001324 A1* | 1/2004 | Ho | H01L 24/05 |
| | | | 257/E23.178 |
| 2008/0315398 A1* | 12/2008 | Lo | H01L 23/5389 |
| | | | 257/706 |
| 2012/0007252 A1* | 1/2012 | Tseng | H01L 23/3677 |
| | | | 257/774 |
| 2013/0088841 A1* | 4/2013 | Ohshima | H01L 23/367 |
| | | | 361/761 |
| 2014/0070397 A1 | 3/2014 | Viswanathan et al. | |
| 2014/0218869 A1* | 8/2014 | Yamanaka | H05K 7/2039 |
| | | | 29/830 |
| 2015/0303164 A1* | 10/2015 | Chen | H01L 24/33 |
| | | | 361/720 |
| 2017/0374748 A1* | 12/2017 | Yang | H05K 1/11 |
| 2018/0042139 A1* | 2/2018 | Rosales | H05K 7/20436 |
| 2018/0132348 A1 | 5/2018 | Berkel et al. | |
| 2018/0190563 A1 | 7/2018 | Magni | |
| 2018/0211899 A1 | 7/2018 | Morianz et al. | |
| 2019/0057924 A1 | 2/2019 | Kim et al. | |
| 2020/0395263 A1 | 12/2020 | Kim et al. | |
| 2021/0136938 A1* | 5/2021 | Wu | G06F 1/1656 |
| 2022/0053634 A1* | 2/2022 | Zhou | H01L 23/427 |
| 2023/0312995 A1* | 10/2023 | Tanii | C09J 7/10 |
| | | | 156/327 |

FOREIGN PATENT DOCUMENTS

| | | |
|---|---|---|
| EP | 3340754 A1 | 6/2018 |
| JP | 2013229548 A | 11/2013 |
| JP | 2014007323 A | 1/2014 |
| KR | 20130140354 A | 12/2013 |

OTHER PUBLICATIONS

First Office Action in Chinese Patent Application No. 202210124766.5; pp. 1-8; Feb. 8, 2024; China National Intellectual Property Administration; No. 6, Xitucheng Lu, Jimenqiao Haidian District, Beijing, 100088, P.R. China.

English Translation of First Office Action in Chinese Patent Application No. 202210124766.5; pp. 1-15; Feb. 8, 2024; China National Intellectual Property Administration; No. 6, Xitucheng Lu, Jimenqiao Haidian District, Beijing, 100088, P.R. China.

* cited by examiner

HEAT REMOVAL ARCHITECTURE FOR STACK-TYPE COMPONENT CARRIER WITH EMBEDDED COMPONENT

CROSS-REFERENCE TO RELATED APPLICATIONS

The present application claims priority to European Patent Application No. 21156188.1 filed Feb. 10, 2021, the disclosure of which is incorporated herein by reference.

TECHNICAL FIELD

The disclosure relates to a method of manufacturing a component carrier, and to a component carrier.

TECHNOLOGICAL BACKGROUND

In the context of growing product functionalities of component carriers equipped with one or more electronic components and increasing miniaturization of such components as well as a rising number of components to be connected to the component carriers such as printed circuit boards, increasingly more powerful array-like components or packages having several components are being employed, which have a plurality of contacts or connections, with ever smaller spacing between these contacts. In particular, component carriers shall be mechanically robust and electrically reliable so as to be operable even under harsh conditions.

For sophisticated electronic tasks, one or multiple components (such as silicon dies) can be embedded in a laminated layer stack of a component carrier (such as a printed circuit board). During operation of the component carrier, the at least one embedded component may generate a considerable amount of heat, for instance due to ohmic losses. However, the heat dissipation of the one or more embedded components is then becoming a real hurdle. In conventional approaches, heat dissipation or management may be inappropriate which introduces shortcomings during operation. By excessive heating during operation, the performance and the reliability of the component carrier may be deteriorated.

SUMMARY

There may be a need for a component carrier which can be manufactured in a compact way and which can be operated with high performance and high reliability.

According to an exemplary embodiment of the invention, a component carrier is provided, wherein the component carrier comprises a stack comprising at least one electrically conductive layer structure and/or at least one electrically insulating layer structure, a component embedded in the stack, and a heat removal body configured for removing heat from the component (in particular during operation of the component carrier) and being connected to the stack (and optionally to the component), the heat removal body comprising a component-sided (i.e., facing the embedded component) first heat removal structure thermally coupled with the component, and a second heat removal structure thermally coupled with the first heat removal structure and facing away from the component (and preferably facing towards an exterior main surface of the component carrier).

According to another exemplary embodiment of the invention, a method of manufacturing a component carrier is provided, wherein the method comprises embedding a component in a stack comprising at least one electrically conductive layer structure and/or at least one electrically insulating layer structure, and connecting a heat removal body to the stack (and optionally to the component), the heat removal body being configured for removing heat from the component and comprising a component-sided first heat removal structure thermally coupled with the component, and a second heat removal structure thermally coupled with the first heat removal structure and facing away from the component.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "stack" may particularly denote an arrangement of multiple planar layer structures which are mounted in parallel on top of one another. The layer structures of the stack may be connected by lamination, i.e., the application of heat and/or pressure.

In the context of the present application, the term "layer structure" may particularly denote a continuous layer, a patterned layer, or a plurality of non-consecutive islands within a common plane.

In the context of the present application, the term "component" may particularly denote an inlay-type member. Such a component may be arranged in an interior of the stack. A component may in particular have an electronic function and may thus be a heat source in view of ohmic losses, etc. For instance, such a component may be a semiconductor die. Embedding the component may result in a component being completely buried within stack material. However, embedding the component in the stack may also be accomplished by inserting the component in a cavity in the stack so that the component still has surface contact, i.e., extends up to a surface of the stack.

In the context of the present application, the term "heat removal body" may particularly denote a physical structure being configured and arranged for removing heat from the embedded component along a predefined thermal path up to an exterior main surface of the component carrier and from there to the environment. More specifically, such a heat removal body may be configured so that the embedded component can be thermally coupled and preferably also mechanically connected to the heat removal body, i.e., in close physical and thus thermal contact.

In the context of the present application, the term "component-sided first heat removal structure of the heat removal body" may particularly denote a highly thermally conductive (in particular having a thermal conductivity of at least 10 W/mK, more particularly of at least 50 W/mK, preferably of at least 100 W/mK) structure being arranged on a side of the heat removal body facing the embedded component.

In the context of the present application, the term "second heat removal structure of the heat removal body facing away from the component" may particularly denote a highly thermally conductive (in particular having a thermal conductivity of at least 10 W/mK, more particularly of at least 50 W/mK, preferably of at least 100 W/mK) structure being arranged on a side of the heat removal body opposing the embedded component and therefore being located closer to an exterior main surface of the component carrier and further away from the embedded component than the first heat removal structure. While the second heat removal structure may be located at a or very close to a main surface of the component carrier, it is also possible that the second heat removal structure is separated from a main surface of the component carrier by one or more further layer structures, wherein a thermally conductive connection of the second heat removal structure to the exterior surface of the component carrier is preferably ensured.

According to an exemplary embodiment of the invention, a component carrier is provided which comprises one or more embedded components in a (preferably laminated) layer stack and which provides an excellent thermal performance and reliability thanks to the provision of a heat removal body in direct physical contact with the stack and optionally, but preferably, with the component. Said heat removal body comprises at least two opposing heat removal structures one of which facing the component and the other facing an exterior side of the component carrier. The heat removal structure facing the component may be directly thermally coupled with the embedded component so as to efficiently remove heat from the embedded component during operation. The other heat removal structure may conduct heat received from the embedded component via the component-sided heat removal structure for guiding said heat out of the component carrier. Hence, an embedded component-type and therefore compact component carrier may be provided which has excellent heat removal or dissipation properties and strong mechanical properties, thereby ensuring excellent thermal performance and reliability. The heat removal body may advantageously function for heat dissipation and cooling of the component carrier.

In the following, further exemplary embodiments of the method and the component carrier will be explained.

In a preferred embodiment, the heat removal body comprises a patterned adhesive sheet (in particular a structured adhesive layer between the first heat removal structure and the second heat removal structure) adhesively bonding and thermally coupling the first heat removal structure with the second heat removal structure. In the context of the present application, the term "patterned adhesive sheet of the heat removal body" may particularly denote a structured (preferably planar) layer with adhesive or sticky properties to be sandwiched between the two opposing heat removal structures of the heat removal body. Thus, the adhesive sheet may hold the two opposing heat removal structures together and may simultaneously ensure a proper thermal coupling between the heat removal structures due to thermally conductive material of the adhesive sheet itself and/or due to thermally conductive material in holes or recesses of the pattered adhesive sheet.

The adhesive sheet may efficiently suppress undesired delamination and may thereby increase the overall mechanical integrity of the component carrier, while thermally coupling the heat removal structures with each other thanks to its intrinsic thermally conductive properties and/or due to thermally conductive material which may be inserted into one or more through holes of the patterned adhesive sheet. The pattern of the adhesive sheet may build up the thermal path between the component, the first heat removal structure, the second heat removal structure, and the environment. The thermal capacity of thermally conductive prepregs may be nevertheless rather low in comparison to copper for instance. Thus, it may be advantageous to drill and fill the adhesive sheet with a material of high thermal conductivity. Therefore, this sheet is not necessarily a thermal prepreg and any other adhesive sheet can be used as well. Additionally, glue can be locally applied, or a photo-imageable resin can be used. By this procedure, the additional drilling (for instance laser drilling) of the prepreg may be avoided. It can however be an advantage if a thermal prepreg is used and if it contributes to the thermal management.

In an embodiment, the first heat removal structure is a continuous thermally conductive sheet. For instance, such a continuous thermally conductive sheet may be planar and free of through holes. A continuous thermally conductive sheet may ensure a two-dimensional heat removal performance over an entire area of the component, as well as a heat spreading and distribution laterally beyond the component. For example, the continuous thermally conductive sheet may be a sufficiently thick copper foil which may be simply laminated on the layer stack with embedded component. It is however also possible that one or more through holes are formed in the thermally conductive sheet which may nevertheless remain continuous, i.e., one common structure rather than separate islands.

Alternatively, the first heat removal structure comprises a plurality of separate thermally conductive pads arranged in a coplanar way. Hence, it is also possible that the first heat removal structure is composed of a number of island-type separate pads in a common plane which may be provided specifically at regions for guiding out heat from the component to an exterior surface of the component carrier. The configuration of the first heat removal structure as separate thermally conductive pads or islands may allow to precisely define heat removal paths in the component carrier to obtain a directed and accurately definable heat removal performance.

In an embodiment, the first heat removal structure comprises a metal (in particular copper) and/or a ceramic. Thus, the first heat removal structure may be thermally conductive, and electrically conductive or insulating.

In an embodiment, the second heat removal structure comprises a patterned thermally conductive sheet or plate comprising multiple through holes. Configuring the second heat removal structure with a patterned sheet with through holes allows to use the second heat removal structure as a mask for patterning the (for instance dielectric) adhesive sheet being arranged deeper in a layer stack obtained during manufacturing the component carrier. The through holes of the second heat removal structure and of the adhesive sheet may then be filled, partially or entirely, with thermally conductive material so as to further increase the thermal conductivity of the heat removal body as a whole.

In an embodiment, the second heat removal structure comprises a metal (in particular copper) and/or a ceramic. Hence, the second heat removal structure may be thermally conductive, and electrically conductive or insulating.

In an embodiment, the through holes of the second heat removal structure and/or of the adhesive sheet are at least partially filled with a thermally conductive filling medium (such as plated metal or a metallic paste) and/or with a phase change material. In the context of the present application, the term "phase change material" may denote a substance which may absorb energy at a phase transition to provide useful cooling of the component carrier and in particular its embedded component. In particular, the transition may be from one of the first two fundamental states of matter—solid and liquid—to the other. The phase transition may also be between non-classical states of matter, such as the conformity of crystals, wherein the phase change material may go from one crystalline structure to another, which may be a higher or lower energy state. Examples of phase change materials are organic materials (which may be derived for instance from petroleum, from plants or from animals) and salt hydrates. Advantageously, it may be possible to fill the created holes with a phase transformation material, i.e., a material which changes its microstructure when heated. By taking this measure, it may be possible to convert thermal energy, created by the at least one embedded component during operation of the component carrier, into mechanical energy. This may release the burden on copper material of the heat removal body in terms of heat dissipation. When the component carrier cools down later (for instance after switching off the component carrier), the phase change material may go back into its original state, so that operation may be reversible or cyclic. Hence, such a phase transformation material may absorb energy from the at least one embedded component and/or from remaining material of the heat removal body during operation. For instance, phase change material may be inserted into the through holes in form of a phase change film and/or a phase change paste.

Advantageously, the phase change material may be provided so as to fill corresponding through holes or recesses of the second heat removal structure and/or of the patterned adhesive sheet only partially, but not entirely. Thereby, it may be possible to leave a part of the volume of the respective through hole unfilled for enabling the phase change material, which may change its volume during its phase transition, to expand without creating excessive stress in an interior of the component carrier.

In an embodiment, the patterned adhesive sheet is electrically insulating and thermally conductive. By configuring the adhesive sheet of an electrically insulating material, the formation of undesired electrical paths in the component carrier may be reliably prevented. By using a thermally conductive material (in particular having a thermal conductivity of at least 1 W/mK, more particularly of at least 5 W/mK, preferably of at least 10 W/mK) for the patterned adhesive sheet, the thermal coupling between the heat removal structures on both opposing sides of patterned adhesive sheet may be promoted.

In an embodiment, the patterned adhesive sheet is a contiguous or continuous structure with a plurality of through holes, in particular with a two-dimensional array of through holes. In particular, the adhesive sheet may be a perforated sheet or layer with multiple through holes. Preferably, the through holes may be filled with a thermally conductive material, in particular copper. The through holes may be filled, partially or entirely, with a material (such as copper) having an even better thermal conductivity than the material of the adhesive sheet itself, to further improve the thermal coupling between the heat removal structures on both opposing sides of the adhesive sheet.

Preferably, in a plan view of the patterned adhesive sheet, a ratio between a partial area of the through holes and a remaining partial area of the adhesive material of the sheet may be at least 20% (or at least 0.2), in particular at least 30% (or at least 0.3). For instance, said ratio may be not more than 80% (or not more than 0.8). A sufficiently large ratio may promote a proper thermal coupling between the two opposing heat removal structures separated by the patterned adhesive sheet, since a through hole filling medium may be selected to have a high thermal conductivity for properly thermally coupling the opposing heat removal structures of the heat removal body. A sufficiently small ratio may ensure proper adhesion between the two opposing heat removal structures by sticky material of the adhesive sheet. A ratio in a range from 20% (or from 30%) to 80% may be advantageous.

In an embodiment, the second heat removal structure is located at or directly next to an exterior main surface of the component carrier. Such an exterior second heat removal structure of the heat removal body may be located at a or very close to a main surface of the component carrier. This may ensure that heat created by the embedded component may be guided outside of the component carrier.

In an embodiment, the method comprises preforming at least part of the heat removal body, and thereafter connecting the preformed at least part of the heat removal body with the stack. By preforming and processing part of the heat removal body separately from the stack, the stack and its embedded component(s) may be reliably prevented from damage or undesired impact during processing said part of the heat removal body (for instance mechanically or by a laser).

In an embodiment, the method comprises preforming at least part of the second heat removal structure (for instance patterning a sheet thereof), and thereafter connecting the preformed at least part of the second heat removal structure with the first heat removal structure (being already connected with the stack and preferably the component) by the adhesive sheet. For instance, the first heat removal structure may be a thick copper foil or the like which may be attached without specific processing to the stack and the embedded component. Thus, neither the stack nor the component will be negatively influenced by connection with the first heat removal structure. The second heat removal structure however may require more extensive processing, in particular patterning, in order to be able to serve as a mask for simplifying patterning the adhesive sheet between the heat removal structures after their mutual connection. Hence, processing the second heat removal structure before connection with the first heat removal structure being already connected to stack and component may comprise forming multiple through holes in a thermally conductive sheet, such as a copper plate.

In an embodiment, the method comprises preforming at least part of the second heat removal structure by inserting an inlay in a through hole of a base sheet and thereafter patterning the inlay, in particular by drilling. In particular, the inlay may be a copper plate or block. Preferably, the base sheet may be a core made of a fully cured printed circuit board (PCB) material such as FR4. Inserting the inlay into an annular base sheet of PCB material involves only low effort and simplifies handling of the inlay during processing, in particular drilling.

In an embodiment, the method comprises connecting at least part of the second heat removal structure with the first heat removal structure by pressing the adhesive sheet between at least part of the second heat removal structure and the first heat removal structure. By applying mechanical pressure, in particular accompanied by the supply of thermal energy, the opposing heat removal structures may be reliably connected by an adhesive force of the adhesive sheet in between. For instance, the adhesive sheet may be made of an at least partially uncured material (such as prepreg), which is cured during the pressing process. During curing, the sheet material may become flowable, may cross-link or may polymerize, and may then be resolidified for permanently connecting the two opposing heat removal structures by an adhesive force.

In an embodiment, the method comprises patterning the adhesive sheet after connecting the preformed at least part of the second heat removal structure with the first heat removal structure. Highly advantageously, the whole surface of the adhesive sheet may be used for interconnecting the opposing heat removal structures by pressing or laminating. After that, the thermal coupling between the opposing heat removal structures may be improved by patterning the adhesive sheet to thereby form through holes which can be later filled by thermally conductive material or phase change material.

In an embodiment, the method comprises patterning the adhesive sheet so that through holes of the patterned adhesive sheet are in alignment with through holes of the second heat removal structure. During the patterning process, the already patterned (and at least at this stage exterior) second heat removal structure may serve as a mask. Consequently, the pattern of through holes extending through the adhesive sheet and extending through the second heat removal structure may correspond to each other. This simplifies the patterning process.

In an embodiment, the method comprises patterning the adhesive sheet by laser processing. Descriptively speaking, a laser beam will only propagate through the through holes in the exterior heat removal structure (preferably made of copper) and will selectively remove exposed material of the adhesive sheet. However, hidden material of the adhesive sheet behind the (preferably copper) material of the exterior heat removal structure will be reliably prevented from being removed by the laser processing and may therefore continue to ensure proper adhesion between the two opposing heat removal structures.

Alternatively, the method may comprise patterning the adhesive sheet by mechanically drilling, etching (in particular plasma etching), photo irradiating a photoimageable dielectric, and/or locally applying a glue. The pattern can be also generated by mechanically drilling or plasma etching. In particular, photoimageable resins can be used. Photoimageable resins can also be removed by exposing and developing processes. Additionally, any glue capable of holding the two structures together can be locally applied.

In an embodiment, the method comprises at least partially filling through holes of a preform of the second heat removal structure and/or through holes of the patterned adhesive sheet with a thermally conductive filling medium and/or a phase change material. By taking this measure, the thermal coupling between the three constituents of the heat removal body, i.e., the two opposing heat removal structures and the adhesive sheet in between, may be significantly improved.

In the following, several processes of embedding a component in the layer stack (without or with access to the surface of the layer stack) according to different embodiments of the invention will be described.

In one embedding embodiment, the method comprises embedding the component in an opening (such as a through hole) of the stack, wherein the opening is at least temporarily closed at a bottom side by a sticky layer during the embedding. In the context of the present application, the term "sticky layer" may particularly denote a tape, film, foil, sheet, or plate having an adhesive surface. In use, the sticky layer may be used to be adhered to a main surface of a stack for closing an opening extending through the stack. The component may be adhered to the sticky layer for defining a position of the component in the opening and thus relative to the stack. When the sticky layer is removed from the stack before completing manufacture of the component carrier, the sticky layer may be denoted as a temporary carrier. In other embodiments, the sticky layer may however form part of the readily manufacture component carrier. By adhering the component on the sticky tape during the embedding process, the spatial accuracy of the embedding of the component may be excellent. Thus, a compact component carrier with high alignment accuracy may be obtained.

In another embedding embodiment, the method comprises mounting the component on at least one of the layer structures, and thereafter covering the assembled component with further ones of the layer structures, wherein at least one of said further layer structures is provided with an opening accommodating the component. For example, the opening of the respective layer structure may be cut as a through hole into the respective layer structure.

In yet another embedding embodiment, the method comprises embedding a release layer in the layer stack, thereafter forming an opening in the layer stack by removing a piece of the layer stack which piece is delimited at a bottom side by the release layer, and thereafter accommodating the component in the opening. For instance, such a release layer may be made of a material showing poorly adhesive properties with respect to surrounding layer stack material. For instance, an appropriate material for the release layer is polytetrafluoroethylene (PTFE), or a waxy compound. For example, the method comprises forming a circumferential cutting trench in the stack extending up to the release layer to thereby separate the piece from a rest of the layer stack. Cutting said trench may be accomplished for example by laser drilling or mechanically drilling.

In yet another embedding embodiment, the method comprises forming an opening in the stack by routing (preferably depth routing), and thereafter accommodating the component on a bottom surface of the routed stack in the opening. Routing is an appropriate and simple mechanism of precisely defining a blind hole-type opening for subsequently accommodating the component.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer, or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through holes through the laminate, for instance by laser drilling or mechanical drilling, and by filling them with electrically conductive material (in particular copper), thereby forming vias as through hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Scale Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal, and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photoimageable or dry-etchable organic material like epoxy-based build-up material (such as epoxy-based build-up film) or polymer compounds like polyimide, polybenzoxazole, or benzocyclobutene-functionalized polymers.

In an embodiment, the at least one electrically insulating layer structure comprises at least one of the group consisting of resin (such as reinforced or non-reinforced resins, for instance epoxy resin or bismaleimide-triazine resin), cyanate ester resin, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (PTFE), a ceramic, and a metal oxide. Reinforcing structures such as webs, fibers, or spheres, for example made of glass (multilayer glass) may be used as well. Although prepreg particularly FR4 are usually preferred for rigid PCBs, other materials in particular epoxy-based build-up film or photoimageable dielectric material may be used as well. For high frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

At least one component, which can be embedded in the stack, can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an optical element (for instance a lens), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer, or a further component carrier, for example in a board-in-board configuration. The component may be surface mounted on the component carrier and/or may be embedded in an interior thereof. Moreover, also other components, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), gold (in particular Hard Gold), chemical tin, nickel-gold, nickel-palladium, Electroless Nickel Immersion Palladium Immersion Gold (ENIPIG), etc.

The aspects defined above and further aspects of the invention are apparent from the examples of embodiment to be described hereinafter and are explained with reference to these examples of embodiment.

DETAILED DESCRIPTION OF ILLUSTRATED EMBODIMENTS

Figure 1:
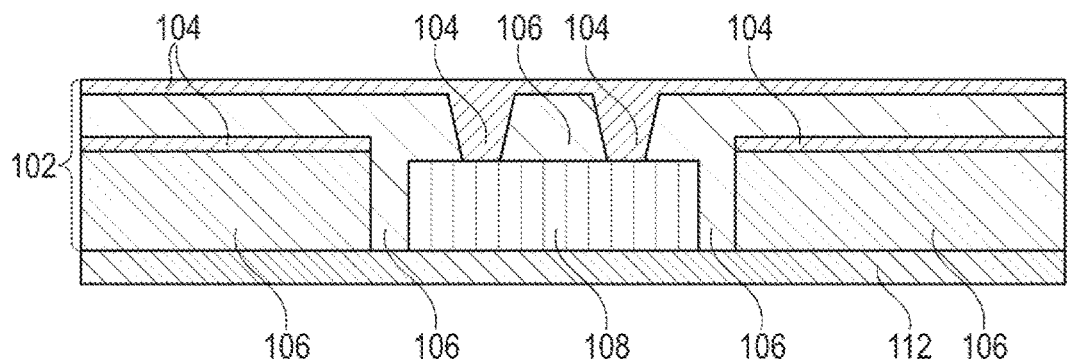
FIG. 1, FIG. 2, FIG. 3, FIG. 4, FIG. 5 and FIG. 6 illustrate cross-sectional views of structures obtained during carrying out a method of manufacturing a component carrier, shown in FIG. 6, according to an exemplary embodiment of the invention.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

According to an exemplary embodiment of the invention, a manufacturing method for a component carrier with embedded component(s) is provided, wherein the construction of the component carrier ensures an efficient removal of heat out of the component carrier. For this purpose, a layer stack with embedded component(s) is connected with a heat removal body of a highly advantageous construction. In particular, a thermally conductive inlay preferably of copper may be inserted into a core comprising a fully cured dielectric material such as FR4 and may be patterned by drilling to thereby create a preform of an exterior removal structure of the heat removal body. A laminated layer stack with one or more embedded components (behaving as heat sources during operation) may then be connected with a thermally conductive sheet as component-sided heat removal structure of the heat removal body. The preform of the exterior heat removal structure may then be connected with the component-sided heat removal structure by an adhesive sheet sandwiched and pressed between the heat removal structures. The mask in form of the patterned preform of the exterior heat removal structure may then be used for correspondingly patterning the adhesive sheet, to thereby expose surface portions of the component-sided heat removal structure. The created holes may then be filled with thermally conductive material (for instance by plating or filling in paste) to therefore complete formation of the heat removal body.

Hence, the heat removal body below the embedded component(s) may in particular comprise a copper layer facing the component, a thermal dielectric to improve adhesion and suppress delamination, and a thick copper or ceramic structure below. The thinner copper layer may also be a layer structure, for instance a patterned layer or an array of pads. The thicker copper or ceramic structure and/or the thermal dielectric may be partially filled with a phase change material for further promoting the heat removal performance. Moreover, the thermal dielectric may comprise an array of drilling holes filled with an electrically conductive material such as copper or a phase change material.

According to an exemplary embodiment of the invention, a thermally conductive frame (preferably made of copper) may be implemented as heat removal structure for heat dissipation from embedded components, such as a semiconductor chip. This may allow to produce a highly reliable embedded package with flexible design and high yield.

A challenge when embedding components in a component carrier is the heat dissipation to avoid reliability failures. There are several methods that allow to reach such target, such as copper inlays, heat pipes, heat sinks, special heat dissipation materials, thermal vias, etc. However, the thermal capability, manufacturing effort and manufacturability of such approaches remains dependent on a product design. In many cases, conventional heat removal structures do not provide sufficient thermal performance.

In order to overcome such and/or other conventional shortcomings, an exemplary embodiment of the invention provides a powerful heat removal concept using copper frames for heat dissipation. As a result, an easy processing of the component carriers may be combined with a high capability of heat dissipation.

In an exemplary embodiment of the invention, it may be possible to create a copper frame within a component carrier (such as a printed circuit board, PCB) that allows dissipating heat from an embedded component to an exterior surface of the component carrier. Such a method may advantageously involve pressing a drilled copper inlay (as exterior heat removal or dissipation structure) on an embedded core or package with thermally conductive layer (as component-sided heat removal or dissipation structure) using a dielectric or electrically conductive bonding layer in form of an adhesive sheet. A laser process or the like may then be used afterwards to desmear or clean drilled holes on the copper sheet to allow a connection to the component. Filling said through holes may be accomplished for example by using a copper plating process or by dispensing or printing thermally conductive paste into the through holes. Descriptively speaking, a copper frame may be used in combination with a structured adhesive sheet and a component-sided heat removal layer for achieving an efficient thermal management of a component carrier with embedded active component(s).

Figure 4:
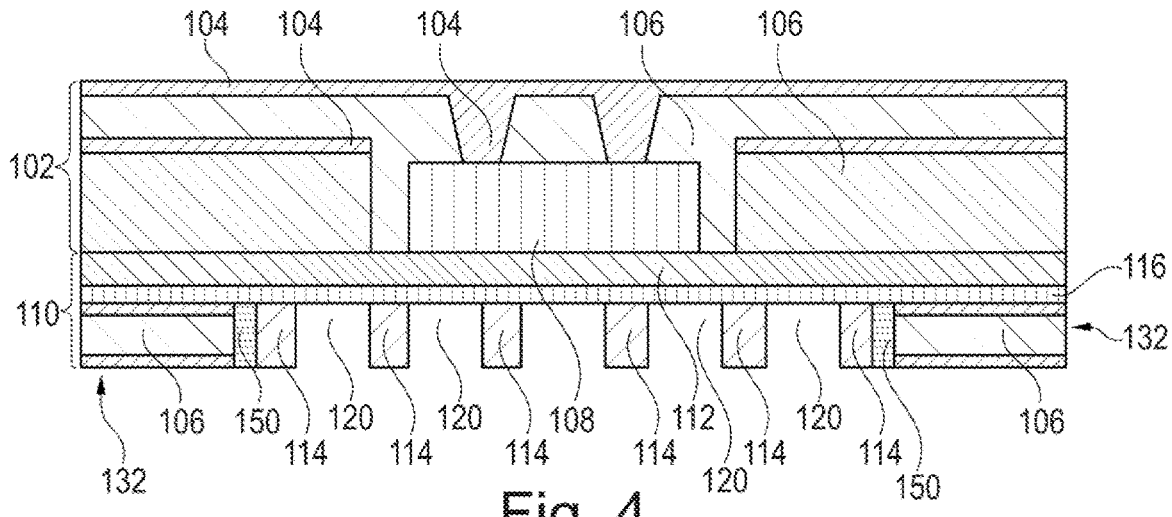
Figure 5:
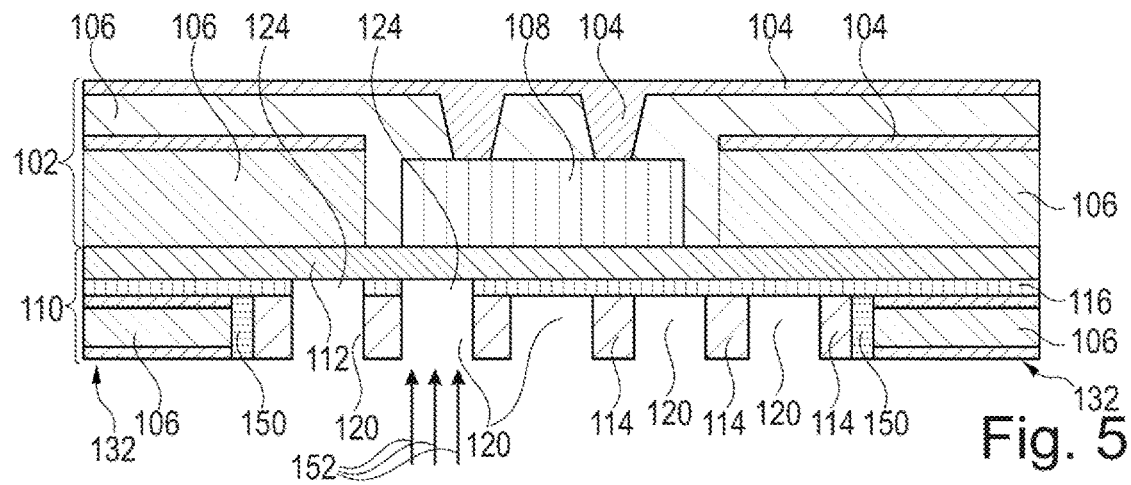
Figure 6:
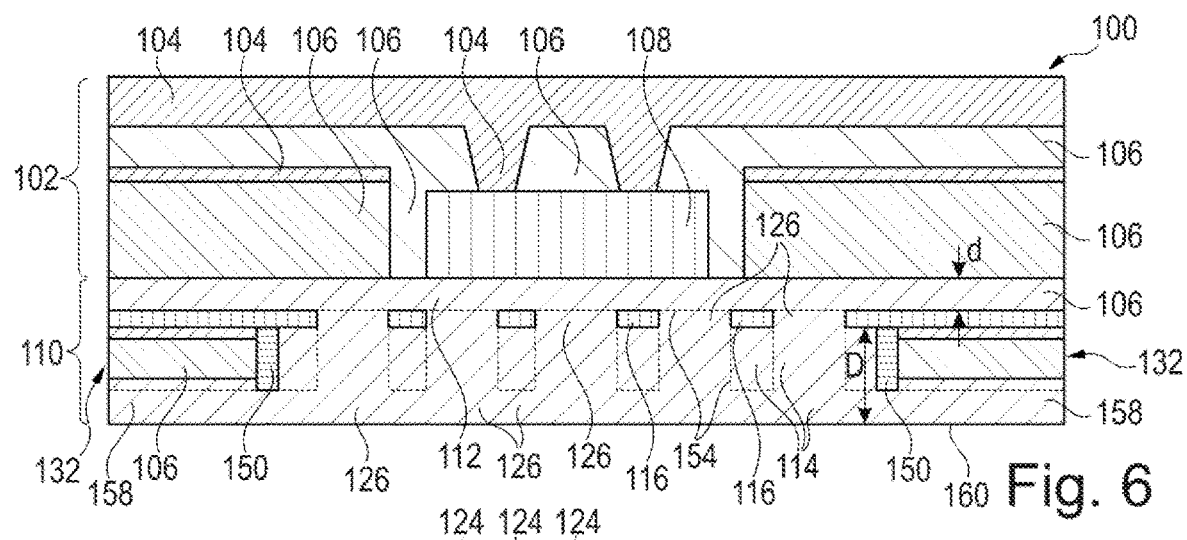

FIG. 1 to FIG. 6 illustrate cross-sectional views of structures obtained during carrying out a method of manufacturing a component carrier 100, shown in FIG. 6, according to an exemplary embodiment of the invention.

Referring to FIG. 1, a cross-sectional view of a laminated layer stack 102 is shown in which an electronic component 108, such as a semi-conductor chip (for instance a MOSFET, metal oxide semiconductor field effect transistor), is embedded. Hence, FIG. 1 shows the result of embed-ding component 108 in stack 102 which comprises a plurality of electrically conductive layer structures 104 and a plurality of electrically insulating layer structures 106.

For example, the electrically conductive layer structures 104 may comprise patterned copper foils and vertical through connections, for example copper filled laser vias. The electrically insulating layer structures 106 may comprise a resin (such as epoxy resin), optionally comprising reinforcing particles therein (for instance glass fibers or glass spheres). For instance, the electrically insulating layer structures 106 may be made of prepreg or FR4 or a build-up film such as ABF. The layer structures 104, 106 may be connected by lamination, i.e., the application of pressure and/or heat.

As shown in FIG. 1 as well, a component-sided first heat removal structure 112 is attached to a lower main surface of the laminated layer stack 102 and to an exposed lower main surface of the embedded component 108. According to FIG. 1, pads of the chip-type semiconductor component 108 are arranged only on the upper surface of component 108 and are electrically contacted by copper filled laser vias of the electrically conductive layer structures 104 directly above and electrically coupled with the component 108. Descriptively speaking, component 108 according to FIG. 1 is thus arranged in a face-up configuration. In other embodiments, embedded components may have a face-down configuration with pads only on the lower side, or with a combined face-up and face-down configuration with pads on both opposing sides. According to FIG. 1, the electric coupling of the component 108 is accomplished above the top side of the component 108, whereas a thermal coupling of the component 108 for removing heat is realized below the bottom side of the component 108, as described below in further detail.

In the shown embodiment, the component-sided first heat removal structure 112 is a copper foil or copper sheet and extends over the entire width of the component carrier 100 to be manufactured (see for instance FIG. 6). The first heat removal structure 112 forms a first constituent of a heat removal body 110 (see for instance FIG. 6) for efficiently removing or dissipating heat created by the embedded component 108 during operation.

Figure 2:
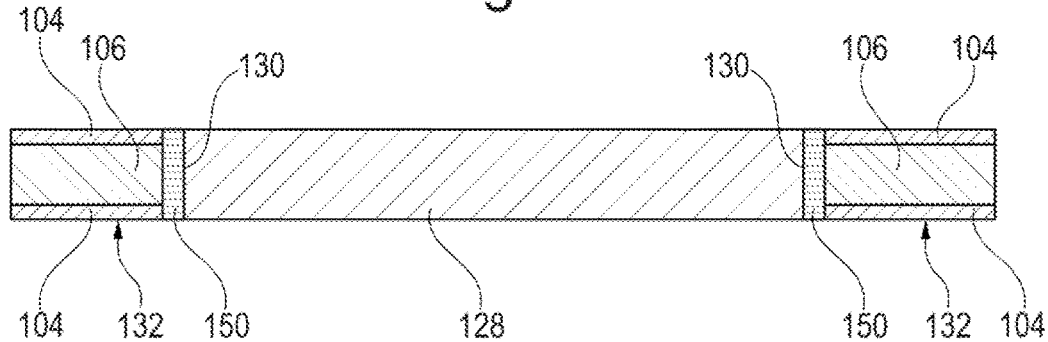

Referring to FIG. 2, a preform of a second heat removal structure 114 of the heat removal body 110 is shown (see again FIG. 6).

Said preform of the second heat removal structure 114 may be created by inserting an inlay 128 in a through hole 130 of a base sheet 132. The inlay 128 may be a copper block or copper sheet or any other body of thermally highly conductive material, such as a ceramic plate. In the shown example, the base sheet 132 may be a fully cured core of resin (in particular epoxy resin) with reinforcing particles (such as glass fibers of glass spheres) therein, for instance FR4 material. Said dielectric core, which may constitute a further electrically insulating layer structure 106, may be covered on both opposing main surfaces with patterned copper foils, constituting further electrically conductive layer structures 104.

For connecting the base sheet 132 with the inlay 128, a lateral gap in between may be filled partially or entirely with a liquid or viscous adhesive 150, which may be solidified by curing.

For instance, the illustrated core with the inlay 128 can be used as a power layer of a readily manufactured component carrier 100.

Figure 3:
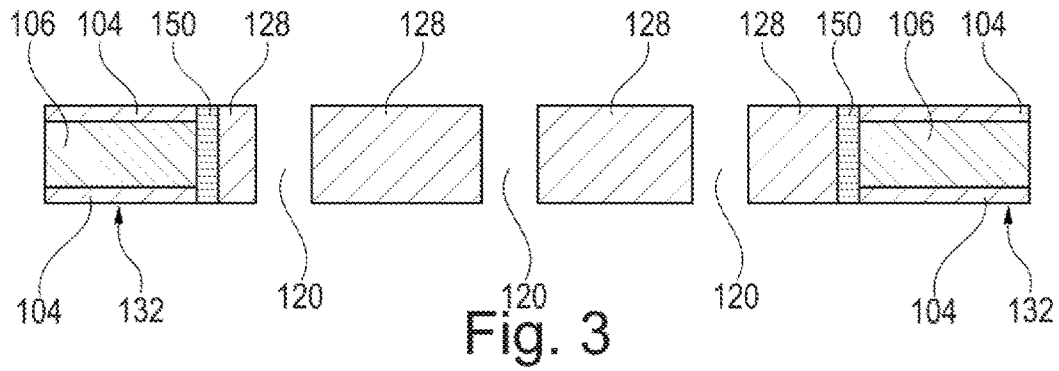

Referring now to FIG. 3, the preform of the second heat removal structure 114 shown in FIG. 2 may be further processed by patterning the inlay 128. This patterning may be carried out by drilling, for instance mechanically drilling or laser drilling, or by plasma etching. Alternatively, a photo-imageable resin can be used, or glue can be locally applied. As a result, through holes 120 may be formed in the inlay 128. More generally, the illustrated preform of the second heat removal structure 114 may be obtained by forming multiple through holes 120 in a highly thermally conductive sheet, which is here embodied as copper inlay 128.

Referring to FIG. 4, the preform of the second heat removal structure 114, obtained according to FIG. 3, may be connected with the structure shown in FIG. 1 (i.e., the first heat removal structure 112 attached to the stack 102 and to the component 108) by a continuous adhesive sheet 116 sandwiched in between. More specifically, connecting the mentioned preform of the second heat removal structure 114 with the first heat removal structure 112 may be accomplished by pressing the adhesive sheet 116 between the preform of the second heat removal structure 114 and the first heat removal structure 112, preferably accompanied by thermal energy.

The adhesive sheet 116 may serve for adhesively bonding and thermally coupling the first heat removal structure 112 with the second heat removal structure 114. For instance, the adhesive sheet 116 sandwiched between the heat removal structures 112, 114 according to FIG. 4 may be a continuous layer of adhesive material. For example, said adhesive material may be at least partially uncured before the pressing process described referring to FIG. 4. By the provision of mechanical pressure and/or thermal heat, the material of the adhesive sheet 116 may be cured to thereby connect the heat removal structures 112, 114 in an adhesive way. For promoting the thermal coupling between the heat removal structures 112, 114 by material of the adhesive sheet 116, it may also be possible to embed thermally conductive filler particles (such as aluminum oxide particles) in a resin matrix of the adhesive sheet 116.

This adhesive sheet 116 between the two heat removal structures 112, 114 can be any adhesive sheet, for instance prepreg. The main thermal path is obtained by drilling holes through the adhesive sheet 116 and subsequently filling the holes with a thermally conductive material, for example copper or thermal pastes. The holes through the prepreg can be obtained for instance by drilling (mechanically or laser drilling) or by plasma etching. An alternative solution is to locally dispense the adhesive material. The thermal conductivity of metals is far above the thermal conductivity of these thermal prepregs. Therefore, it is advantageous to pattern the adhesive sheet 116 to obtain a region with locally increased thermal conductivity. Thus, the adhesive sheet 116 can be any material capable of holding the two heat removal structures 112, 114 together.

When taken together and still referring to FIG. 4, the component-sided first heat removal structure 112, the preform of the exterior second heat removal structure 114, and the preform of the adhesive sheet 116 in between constitute a preform of a heat removal body 110 connected in a thermally conductive way to the stack 102 and to the component 108. The readily manufactured heat removal body 110 according to FIG. 6 is then capable of removing heat from the component 108 out of the stack 102. However, in order to further improve the thermal performance of the heat removal body 110 and its impact on the thermal reliability of the component carrier 100 to be manufactured, the properties of the heat removal body 110 may be further refined, as will be described in the following referring to FIG. 5 and FIG. 6.

Referring to FIG. 5, the structure shown in FIG. 4 may be made subject to a desmear or cleaning process acting on the drilled through holes 120 in the patterned inlay 128.

More specifically, the process illustrated in FIG. 5 comprises patterning the previously continuous adhesive sheet 116 by processing the structure of FIG. 4 with a laser beam 152 from the bottom side, i.e., after connecting the preform of the second heat removal structure 114 with the first heat removal structure 112. Laser beam 152 may be configured for removing exposed material of the adhesive sheet 116, while copper material of the patterned inlay 128 covering sections of the adhesive sheet 116 will be protected from being removed by the laser beam 152. Descriptively speaking, the patterned inlay 128 functions as a mask for patterning the adhesive sheet 116 by laser processing. Hence, the process illustrated referring to FIG. 5 patterns the adhesive sheet 116 so that through holes 124 of the patterned adhesive sheet 116 are in alignment with through holes 120 of the second heat removal structure 114.

For example, the connection between different parts of the illustrated structure can be done by mechanical or laser drilling (for instance using a conformal mask, drilling by laser through core and sheet, etc.).

Referring to FIG. 6, the illustrated component carrier 100 according to an exemplary embodiment of the invention can be obtained by filling the through holes 120 of the preform of the second heat removal structure 114 and the aligned through holes 124 of the patterned adhesive sheet 116 with a highly thermally conductive filling medium 126, for instance having a thermal conductivity of at least 50 W/mK. This may be accomplished for example by plating (in particular copper plating) or by printing a thermally conductive paste (in particular a copper paste or a silver paste) to fill the through holes 120, 124 and to thermally connect the embedded component 108 to a bottom exterior surface of the component carrier 100.

When the thermally conductive filling medium 126 is formed by plating and when the structured inlay 128 is made of copper, thermally conductive filling medium 126 may be formed in the through holes 120, 124 and may also be formed on a bottom side of the structure of FIG. 5 outside of the through holes 120, 124, as illustrated in FIG. 6 schematically with reference signs 158.

Dotted lines 154 in FIG. 6 illustrate a material interface between material of the component-sided first heat removal structure 112 (for instance copper) and the patterned inlay 128 (for instance copper) of the exterior second heat removal structure 114 on the one hand, and the thermally conductive filling medium 126 (such as plated copper) on the other hand.

As a result of the described manufacturing process, the illustrated cross-section of component carrier 100 according to an exemplary embodiment of the invention is obtained.

In the shown embodiment, the component carrier 100 is configured as a printed circuit board (PCB). The component carrier 100 comprises the laminated layer stack 102 comprising the electrically conductive layer structures 104 and the electrically insulating layer structures 106. The semiconductor component 108 is embedded in the stack 102 with surface contact to component-sided first heat removal structure 112 of heat removal body 110. Said heat removal body 110, which also forms part of component carrier 100, is configured for removing heat from the component 108 towards lower main surface 160 of component carrier 100 and outside of the component carrier 100. The heat removal body 110 is connected with direct physical contact to both the stack 102 and the component 108 to thereby establish a highly thermally conductive connection. Apart from the component-sided first heat removal structure 112 which is directly thermally coupled with the component 108, the heat removal body 110 furthermore comprises the exterior second heat removal structure 114. The latter is thermally coupled with the first heat removal structure 112 predominantly by the thermally conductive filling medium 126 in the through holes 124 of the adhesive sheet 116. Thus, the thermally conductive filling medium 126 is inserted in recesses of the patterned adhesive sheet 116 which is provided for adhesively bonding and thermally coupling the first heat removal structure 112 with the second heat removal structure 114. When the material of the patterned adhesive sheet 116 itself is thermally conductive as well, for instance by providing it with highly thermally conductive filler particles (for instance made of aluminum oxide), also the material of the adhesive sheet 116 may contribute significantly to the thermal coupling between the heat removal structures 112, 114.

In the shown embodiment, the first heat removal structure 112 is a continuous thermally conductive sheet made of copper. A vertical thickness, d, of the first heat removal structure 112 may for instance be at least 50 µm, in particular at least 100 µm, more particularly at least 200 µm. However, the first heat removal structure 112 may also be thinner. In contrast to this, the second heat removal structure 114 is a patterned thermally conductive copper sheet comprising multiple through holes 120 and being located at exterior main surface 160 of the component carrier 100. Said through holes 120 are filled with a thermally conductive filling medium 126 which may be embodied as plated copper. Just as an example, a vertical thickness, D, of thermally conductive material of the second heat removal structure 112 may for instance be at least 100 µm, in particular at least 200 µm, more particularly at least 500 µm. More generally, the vertical thickness, D, of thermally conductive material of the second heat removal structure 114 may be larger than the vertical thickness, d, of the first heat removal structure 112. However, the thickness, D, depends mainly on the requirements of a specific application. If thin build-ups are desired, the thickness, D, of the thermally conductive material of the second heat removal structure 112 may be chosen in compliance with these requirements.

Figure 7:
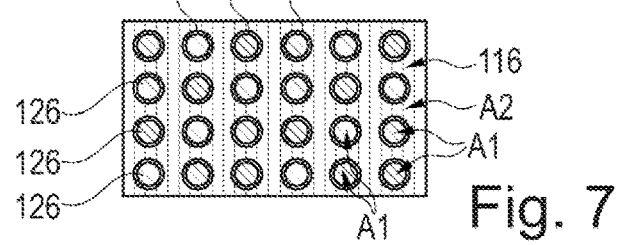
FIG. 7 illustrates a plan view of a layer of the component carrier of FIG. 6.

FIG. 7 illustrates a plan view of layer-type patterned adhesive sheet 116 of the component carrier 100 of FIG. 6.

The patterned adhesive sheet 116 may be electrically insulating and thermally conductive. For instance, the adhesive sheet 116 may be cured prepreg with highly thermally conductive filler particles. It is also possible that the adhesive sheet 116 is an adhesive resin without reinforcing particles and/or without highly thermally conductive filler particles. As shown in FIG. 7, said patterned adhesive sheet 116 may be a contiguous planar structure with a plurality of through holes 124 arranged in rows and columns. In other words, the through holes 124 may be arranged in a matrix like pattern to form a regular (or alternatively irregular) two-dimensional array of through holes 124. As shown as well in FIG. 7, said through holes 124 of the patterned adhesive sheet 116 are filled with a thermally conductive filling medium 126, such as plated metal or a metallic paste.

In the illustrated plan view of the patterned adhesive sheet 116, a ratio between a partial area, A1, of all through holes 124 together and a remaining partial area, A2, of the adhesive material of the sheet 116 may be at least 20% or 0.2. The sum of A1 and A2 may be the entire surface area of the patterned adhesive sheet 116 with filled through holes 124, as shown in FIG. 7. As a result of the described design rule, the copper filled adhesive sheet 116 may significantly contribute to the heat removal performance of the heat removal body 110 while simultaneously suppressing delamination and promoting integral mechanical stability of the component carrier 100 as a whole.

In particular, the size of the plated through holes 124 may be selected depending on size of component 108, aspect ratio for filling, minimum via density or pitch, etc. For instance, a 50% routing density may be an appropriate choice.

A proper configuration of the heat removal body 110 may result in an advantageous two-dimensional heat dissipation through the copper layer(s), three-dimensional heat dissipation through the thermal sheet, and a radial exchange between plated through holes and thermal sheet.

Moreover, heat transformation may further promote the heat removal capability, heat dissipation or cooling efficiency when a phase change material 122 is inserted in the through holes 120, 124, as described below in further detail referring to FIG. 8.

Figure 8:
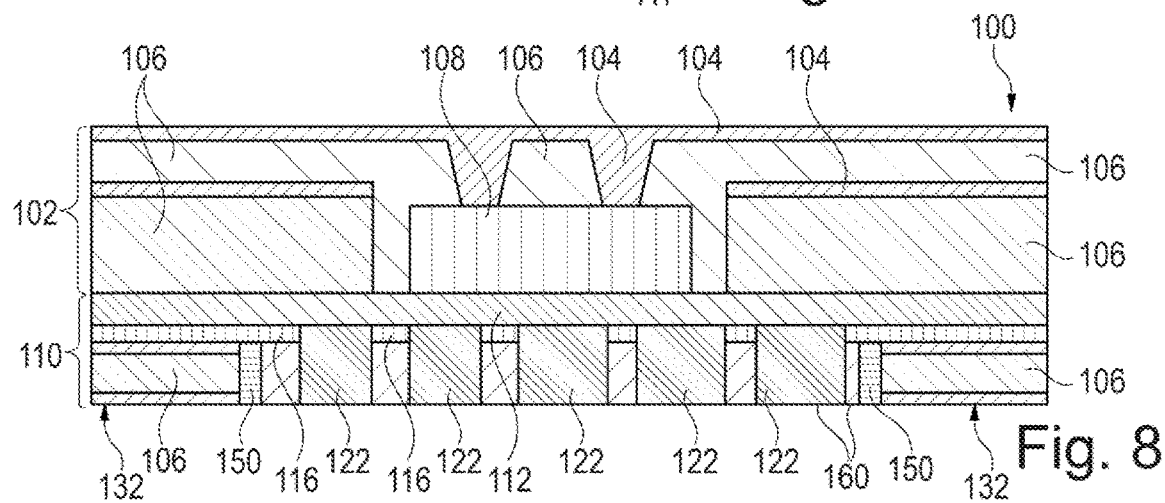
FIG. 8 illustrates a cross-sectional view of a component carrier according to another exemplary embodiment of the invention.

FIG. 8 illustrates a cross-sectional view of a component carrier 100 according to another exemplary embodiment of the invention.

The embodiment of FIG. 8 differs from the embodiment of FIG. 6 in particular in that, according to FIG. 8, the through holes 120, 124 are filled with a phase change material 122 rather than with plated or paste-type copper. Furthermore, the horizontal bottom surface of the component carrier 100 may remain free of additional material, so that the patterned base sheet 132 is exposed according to FIG. 8.

The phase change material 122 may be a material which changes its microstructure when heated so that it may be possible to convert thermal energy created by the embedded component 108 during operation of the component carrier 100 into mechanical energy by means of the phase change material 122. This may further improve the heat removal capability of the heat removal body 110. The phase change may be reversible, so that the subsequent down cooling of the component carrier 100 (after operation) may switch back the phase change material 122 into its initial state. Although not shown in FIG. 8, the phase change material 122 may be provided so as to fill corresponding through holes 120, 124 only partially, since phase change materials 122 may change their volume during phase transition. Empty spaces remaining after partially filling the through holes 120, 124 with phase change material 122 may then accommodate expanding phase change material 122 in the event of a phase change. The provision of a phase change material 122 in addition to the copper cooling structures may further increase the efficiency of heat removal.

For instance, the phase change material 122 may be inserted into the through holes 120, 124 as a paste or as a sheet. Thermo-composites may also be used, i.e., a resin system for promoting adhesion and processability, and may be filled with filler particles comprising phase change material 122.

Figure 9:
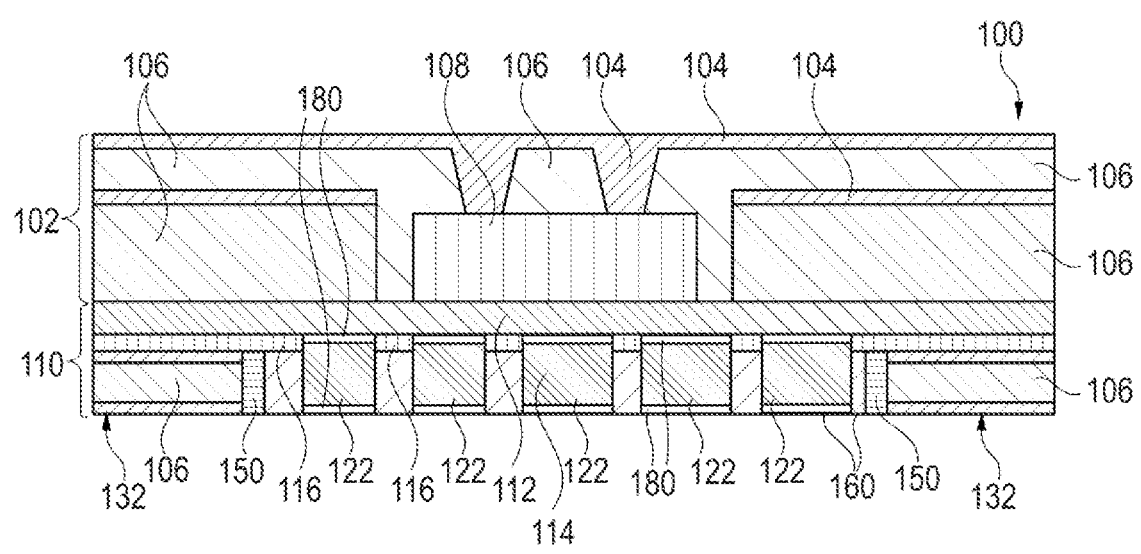
FIG. 9 illustrates a cross-sectional view of a component carrier according to another exemplary embodiment of the invention.

FIG. 9 illustrates a cross-sectional view of a component carrier 100 according to another exemplary embodiment of the invention.

The embodiment of FIG. 9 differs from the embodiment of FIG. 8 in that, according to FIG. 9, the component carrier 100 comprises a dielectric thermal interface material 180 at a top side and at a bottom side of the second heat removal structure 114. Alternatively, a dielectric thermal interface material 180 may be provided only at a top side or at a bottom side of the second heat removal structure 114 (not shown). In FIG. 9, the second heat removal structure 114 comprises a phase change material 122.

Advantageously, such a dielectric thermal interface material 180 above and/or below the phase change material 122 may be provided in order to electrically separate the bottom side of the structure. This may be advantageous for high-current applications to allow external cooling and to prevent electric shocks.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A component carrier, comprising:
   a stack comprising at least one electrically conductive layer structure and/or at least one electrically insulating layer structure;
   a component embedded in the stack; and
   a heat removal body configured for removing heat from the component and being connected to the stack and to the component, wherein the heat removal body is in direct contact with the component, the heat removal body comprising:
   a component-sided first heat removal structure thermally coupled with the component; and
   a second heat removal structure thermally coupled with the first heat removal structure and facing away from the component,
   wherein the second heat removal structure comprises a dielectric thermal interface material at a top side and/or at a bottom side,
   wherein the second heat removal structure comprises a phase change material, the dielectric thermal interface material directly contacting the phase change material.

2. The component carrier according to claim 1, wherein the first heat removal structure is a continuous thermally conductive sheet or comprises a plurality of thermally conductive pads.

3. The component carrier according to claim 1, comprising at least one of the following features:
   wherein the first heat removal structure comprises at least one of the group consisting of a metal, and a ceramic;
   wherein the second heat removal structure comprises a patterned thermally conductive sheet comprising multiple through holes, wherein the through holes are at least partially filled with at least one of the group consisting of a thermally conductive filling medium, and the phase change material.

4. The component carrier according to claim 1, wherein the second heat removal structure comprises at least one of the group consisting of a metal, and a ceramic.

5. The component carrier according to claim 1, wherein the heat removal body comprises a patterned adhesive sheet adhesively bonding and thermally coupling the first heat removal structure with the second heat removal structure.

6. The component carrier according to claim 5, comprising at least one of the following features:
   wherein through holes of the patterned adhesive sheet are at least partially filled with at least one of the group consisting of a thermally conductive filling medium, and the phase change material;
   wherein the patterned adhesive sheet is electrically insulating and thermally conductive;
   wherein the patterned adhesive sheet is a contiguous structure with the plurality of through holes, wherein a ratio between a partial area of the through holes and a remaining partial area of the adhesive material of the patterned adhesive sheet is at least 20%, and not more than 80%.

7. The component carrier according to claim 1, wherein the second heat removal structure is located at or directly next to an exterior main surface of the component carrier.

8. The component carrier of claim 1,
   wherein the component is embedded entirely within the stack, and
   wherein adjacent surfaces of the stack and the heat removal body are respective planar surfaces.

9. The component carrier of claim 1,
   wherein the second heat removal structure of the heat removal body is bounded by an insulating layer along a surface opposed to the embedded component and the first heat removal structure.

10. The component carrier of claim 1,
    wherein the second heat removal structure of the heat removal body is bounded laterally by an adhesive removed from the first heat removal structure.

11. A method of manufacturing a component carrier, wherein the method comprises:
    embedding a component in a stack which comprises at least one electrically conductive layer structure and/or at least one electrically insulating layer structure; and
    connecting a heat removal body to the stack and to the component, the heat removal body being configured for removing heat from the component,
    wherein the heat removal body is in direct contact with the component, the heat removal body comprising:
    a component-sided first heat removal structure thermally coupled with the component; and
    a second heat removal structure thermally coupled with the first heat removal structure and facing away from the component,
    wherein the second heat removal structure comprises a dielectric thermal interface material at a top side and/or at a bottom side,
    wherein the second heat removal structure comprises a phase change material, the dielectric thermal interface material directly contacting the phase change material.

12. The method according to claim 11, wherein the method comprises:
    preforming at least part of the heat removal body; and
    thereafter connecting the preformed at least part of the heat removal body with the stack.

13. The method according to claim 11, wherein the method comprises:
    providing the heat removal body with a patterned adhesive sheet adhesively bonding and thermally coupling the first heat removal structure with the second heat removal structure.

14. The method according to claim 13, wherein the method comprises:
    preforming at least part of the second heat removal structure by forming multiple through holes in a thermally conductive sheet; and
    thereafter connecting the preformed at least part of the second heat removal structure with the first heat removal structure, being already connected with the stack and the component, by the adhesive sheet.

15. The method according to claim 14, comprising at least one of the following features:
    wherein the method comprises preforming at least part of the second heat removal structure by inserting an inlay in a through hole of a base sheet and thereafter patterning the inlay;
    wherein the method comprises connecting at least part of the second heat removal structure with the first heat removal structure by pressing the adhesive sheet between the at least part of the second heat removal structure and the first heat removal structure;
    wherein the method comprises patterning the adhesive sheet after connecting the preformed at least part of the second heat removal structure with the first heat removal structure.

16. The method according to claim 13, wherein the method comprises:
    patterning the adhesive sheet so that through holes of the patterned adhesive sheet are in alignment with through holes of the second heat removal structure.

17. The method according to claim 13, wherein the method comprises:
    patterning the adhesive sheet by at least one of the group consisting of laser processing, mechanically drilling, etching, photo irradiating a photoimageable dielectric, and locally applying a glue.

18. The method according to claim 13, wherein the method comprises:
    at least partially filling through holes of a preform of the second heat removal structure and/or through holes of the patterned adhesive sheet with at least one of the group consisting of a thermally conductive filling medium, and the phase change material.

* * * * *